(12) United States Patent
Uebele

(10) Patent No.: US 6,271,694 B1
(45) Date of Patent: *Aug. 7, 2001

(54) MONOLITHICALLY INTEGRATED OUTPUT STAGE

(75) Inventor: Manfred Uebele, Reutlingen (DE)

(73) Assignee: Robert Bosch GmbH, Stuttgart (DE)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/143,235

(22) Filed: Aug. 28, 1998

(30) Foreign Application Priority Data

Sep. 8, 1997 (DE) .............................. 197 39 273

(51) Int. Cl.[7] .................................................. H03B 1/00
(52) U.S. Cl. .................................... 327/110; 327/483
(58) Field of Search .............................. 327/110, 108, 327/109, 111, 112, 478, 482, 483

(56) References Cited

U.S. PATENT DOCUMENTS 5,539,301 * 7/1996 Uebele ............................... 323/282

FOREIGN PATENT DOCUMENTS 43 33 359  1/1995 (DE) .

* cited by examiner

Primary Examiner—Jeffrey Zweizig
(74) Attorney, Agent, or Firm—Kenyon & Kenyon

(57) ABSTRACT

A monolithically integrated output stage includes an arrangement for detecting the load current through a power switching transistor and/or an arrangement for detecting the output voltage at a power switching transistor and/or an arrangement for detecting the chip temperature. A switching logic of the monolithically integrated output stage includes at least one output transistor for switching the output transistor on reaching at least one predetermined load current threshold and/or output voltage threshold and/or temperature threshold, where the output transistor supplies a high signal at at least one logic output. The emitter of the output transistor is coupled to the logic output, and a switching device is provided to block the output transistor at a negative collector voltage of the power switching transistor.

5 Claims, 3 Drawing Sheets

MONOLITHICALLY INTEGRATED OUTPUT STAGE

FIELD OF THE INVENTION

The present invention relates to a monolithically integrated output stage.

BACKGROUND INFORMATION

Known monolithically integrated output stages are used to detect a load current threshold. whereby a switching signal is supplied by a switching logic unit over an output transistor on reaching a set load current threshold. Such output stages are used, for example, in electronic ignition control devices for motor vehicles.

German Published Patent Application No. 43 33 359 A1 describes such a monolithically integrated output stage. However, a disadvantage of the output stage described in German Published Patent Application No. 43 33 359 A1 is that the collector of the switching transistor of the output stage is pulled to an inverse voltage of <0 volt when inductive loads are switched, so that the output transistor of the switching logic can be notched up (i.e becomes unblocked). This occurs despite the fact that the threshold of the load current to be detected has not been reached. This leads to corruption of the signal.

To keep the output transistor blocked even when the collector voltage drops below 0 volt, German Patent Application No. 43 33 359 A1 proposes that a malfunction of the switching logic in inverse operation of the output stage be achieved over a potential-limiting diode and an additional transistor. The output transistor is wired here as a pull-down transistor, so that the interference signals can only be removed at a considerable expense.

SUMMARY OF THE INVENTION

An object of the present invention is to provide a monolithically integrated output stage that avoids, in a simple manner that is advantageous over the known output stage discussed above, the malfunction of an output transistor in an inverse operation of the output stage. Because the emitter of the output transistor is connected to the logic output and a switching means is provided which blocks the output transistor in response to a negative collector voltage of the power switching transistor, a high interference immunity is achieved because the output transistor which is wired as a pull-Up transistor can be activated only by an active high signal which is in phase opposition to a low interference signal, and noise-free activation over a transistor is also achieved. The output transistor thus remains reliably blocked even in inverse operation of the output stage where the collector voltage drops below 0 volt, and it does not supply an output signal that signals a load current threshold value.

DETAILED DESCRIPTION

Figure 1:
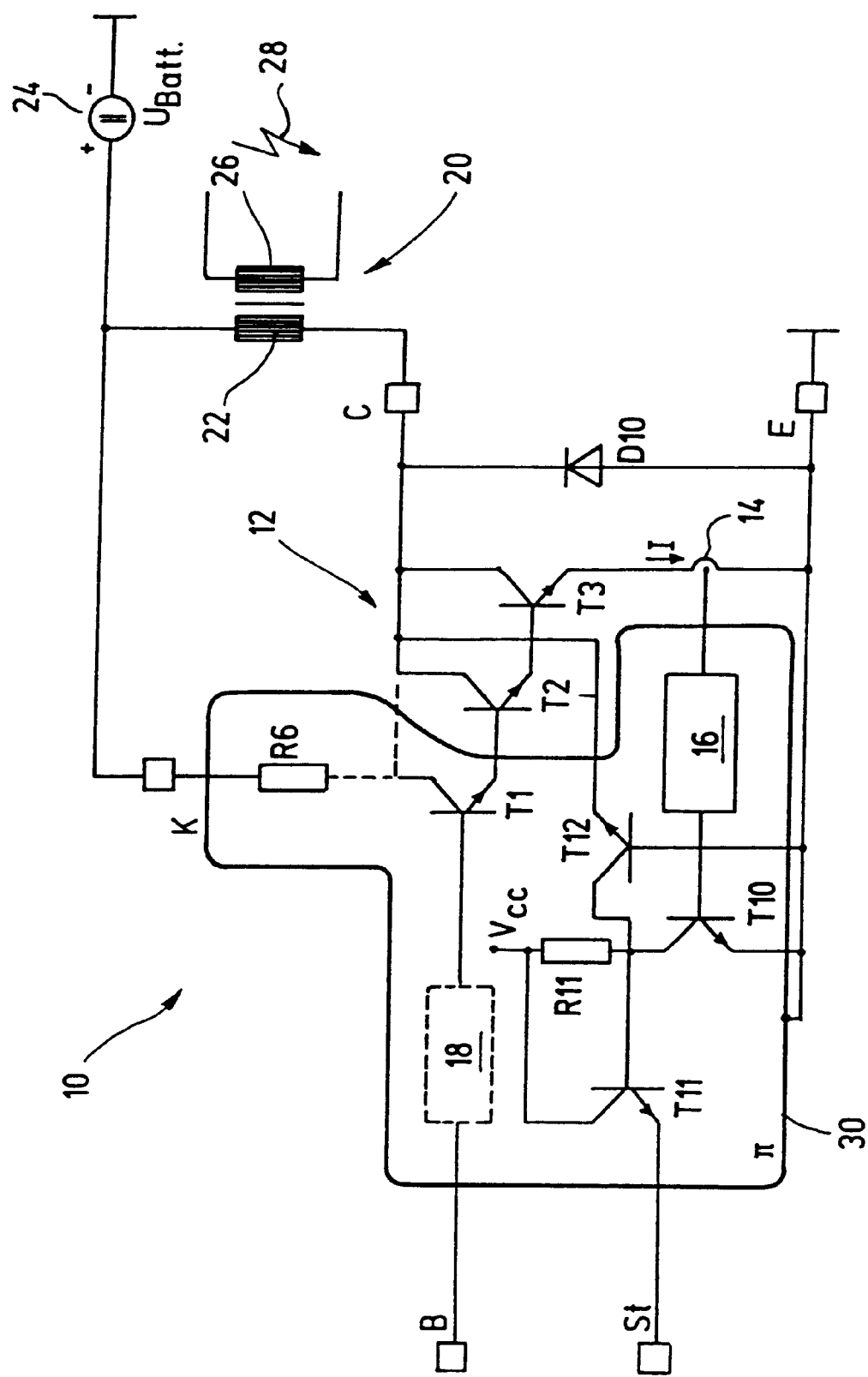
FIG. 1 shows a diagram of a monolithically integrated output stage in accordance with the present invention.

FIG. 1 shows a monolithically integrated output stage 10 with a power switching transistor 12 which has transistors T1, T2, T3. The base of power switching transistor 12 is connected to an external base terminal B; the emitter is connected to an external emitter terminal E; and the collector is connected to an external collector terminal C. As an alternative, power switching transistor 12 may also be designed with two or three stages. A current sensor 14, which is designed as a sensor cell of transistor stage T3 of power switching transistor 12, detects a load current I through power switching transistor 12 and is connected to a logic circuit 16 (not shown in detail). Logic circuit 16 contains at least one threshold element to supply a control signal for an output transistor T11 as a function of an adjustable load current threshold of load current I.

Output stage 10 also has an inverse diode D10 bridging the contact gap of power switching transistor 12. The collector of first switching stage T1 of power switching transistor 12 is connected to external collector terminal C or, across a collector resistor R6 to another external terminal K. Terminal K and collector resistor R6 are omitted when the collector of switching stage T1 is connected to external collector terminal C. The two alternative switching options are illustrated by the connection paths shown with dotted lines.

To activate output transistor T11, the output terminal of logic circuit 16 is connected to the base of a transistor T10. The collector of transistor T10 is connected to the base of output transistor T11 and, across a resistor R11, to a potential tap $V_{cc}$ and to the collector of another transistor T12. The emitter of output transistor T11 is connected to a logic output St. The collector of output transistor T11 is also connected to potential terminal $V_{cc}$. The emitter of transistor T12 is connected to external collector terminal C, while the base of transistor T12 and the emitter of transistor T10 are connected to external emitter terminal E.

Furthermore, a control logic 18 which is only indicated here activates power switching transistor 12 in a manner not explained in greater detail here, as a function of an external signal applied to base terminal B and optionally a voltage applied to external terminal K.

Output stage 10 shown in FIG. 1 serves, for example, to control an ignition coil 20 of an ignition system of an internal combustion engine for motor vehicles. Primary winding 22 is connected to external collector terminal C and to a power supply voltage source 24. e.g. an automotive battery. Secondary winding 26 of ignition coil 20 generates ignition pulses in a known way for a spark plug 28. which is merely indicated here.

In the case when external terminal K is connected to the collector of first switching stage T1 it is also connected to the positive terminal of power supply voltage source 24.

Potential terminal $V_{cc}$ can be supplied from external terminal K or B.

Figure 2A:
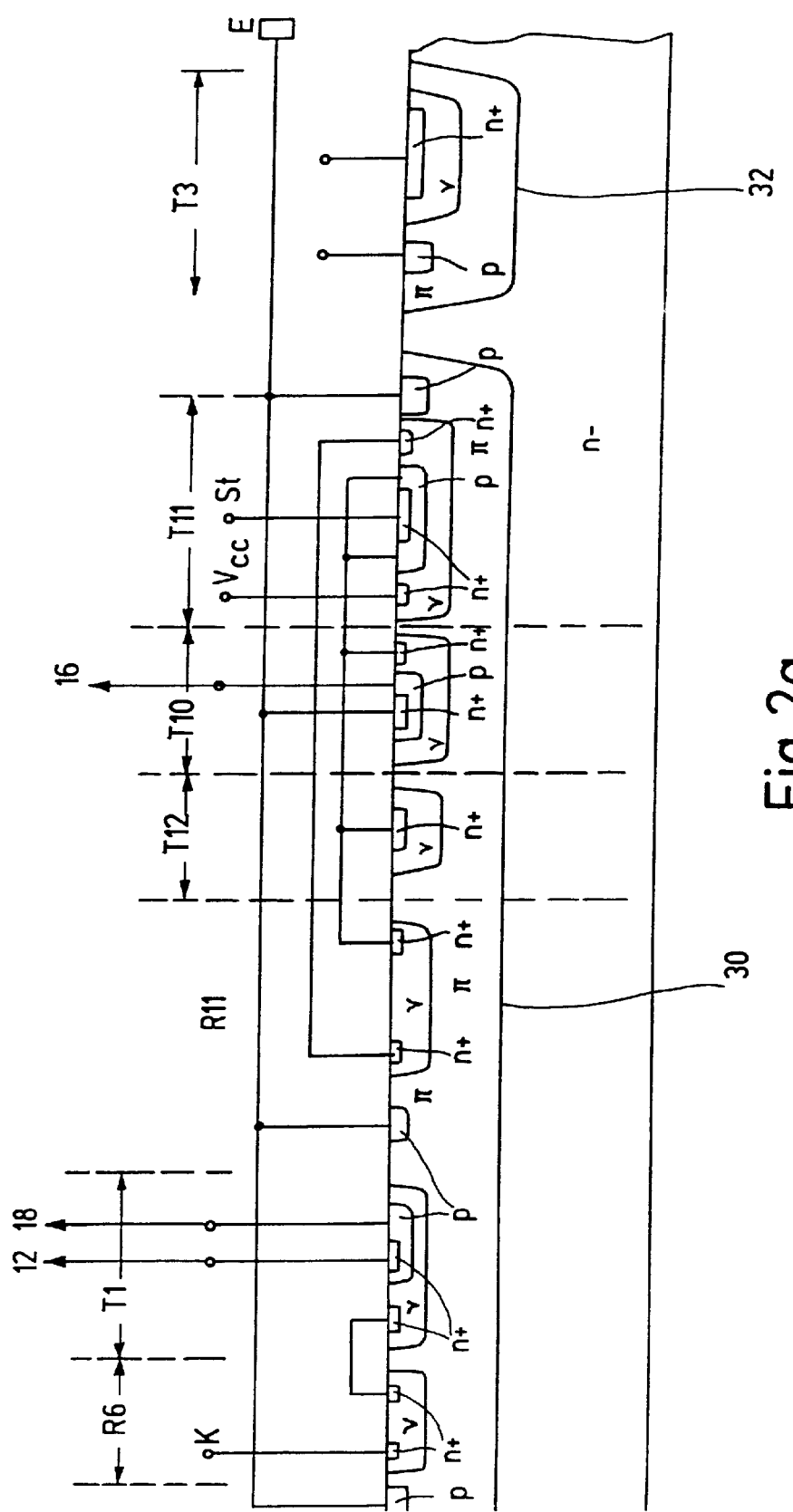
FIG. 2a shows a first diagram of the diffusion zones that are present in the output stage of FIG. 1.

FIG. 2a shows a schematic sectional diagram through monolithically integrated output stage 10 according to a first embodiment of the present invention. $\pi$ region defines a weakly doped p region, and the $\nu$ region defines a weakly doped n region. Output transistor T11 as well as transistors T1, T10 and T12 and resistors R6 and R11 are integrated into a common $\pi$ trough 30. The emitter of output transistor T11 is formed by an $n^+$ region; the base of output transistor T11 is formed by a p region surrounding this $n^+$ region; and the collector of output transistor T11 is formed by a $\nu$ region which in turn surrounds this p region. The emitter of output transistor T11 is connected to logic output St. The collector of output transistor T11 is connected to potential terminal $V_{cc}$. The emitter of transistor T10 is formed by an $n^+$ region, the base of transistor T10 is formed by a p region surrounding the $n^+$ region and the collector of transistor T10 is formed by a $\nu$ region surrounding this p region. The base of transistor T10 is connected to logic circuit 16, while the emitter of transistor T10 is connected to external emitter terminal E.

Transistor T12 is defined by an n⁺ region with the surrounding ν region forming the collector of transistor T12, the substrate (n⁻ region) forming the emitter of transistor T12, and the base of transistor T12 being formed by π trough 30. A ν region which forms resistor R11 is also provided.

External terminal K is connected to an n⁺ region which is surrounded by a ν region forming resistor R6. The ν region of resistor R6 is connected to a ν region which forms the collector of transistor T1. This ν region encloses a p region forming the base of transistor T1. This p region in turn surrounds an n⁺ region which forms the emitter of transistor T1.

π trough 30 is connected to external emitter terminal E over one or more terminals (three in this example) designed as p regions. There is a good ohmic connection over the p regions.

Figure 2B:
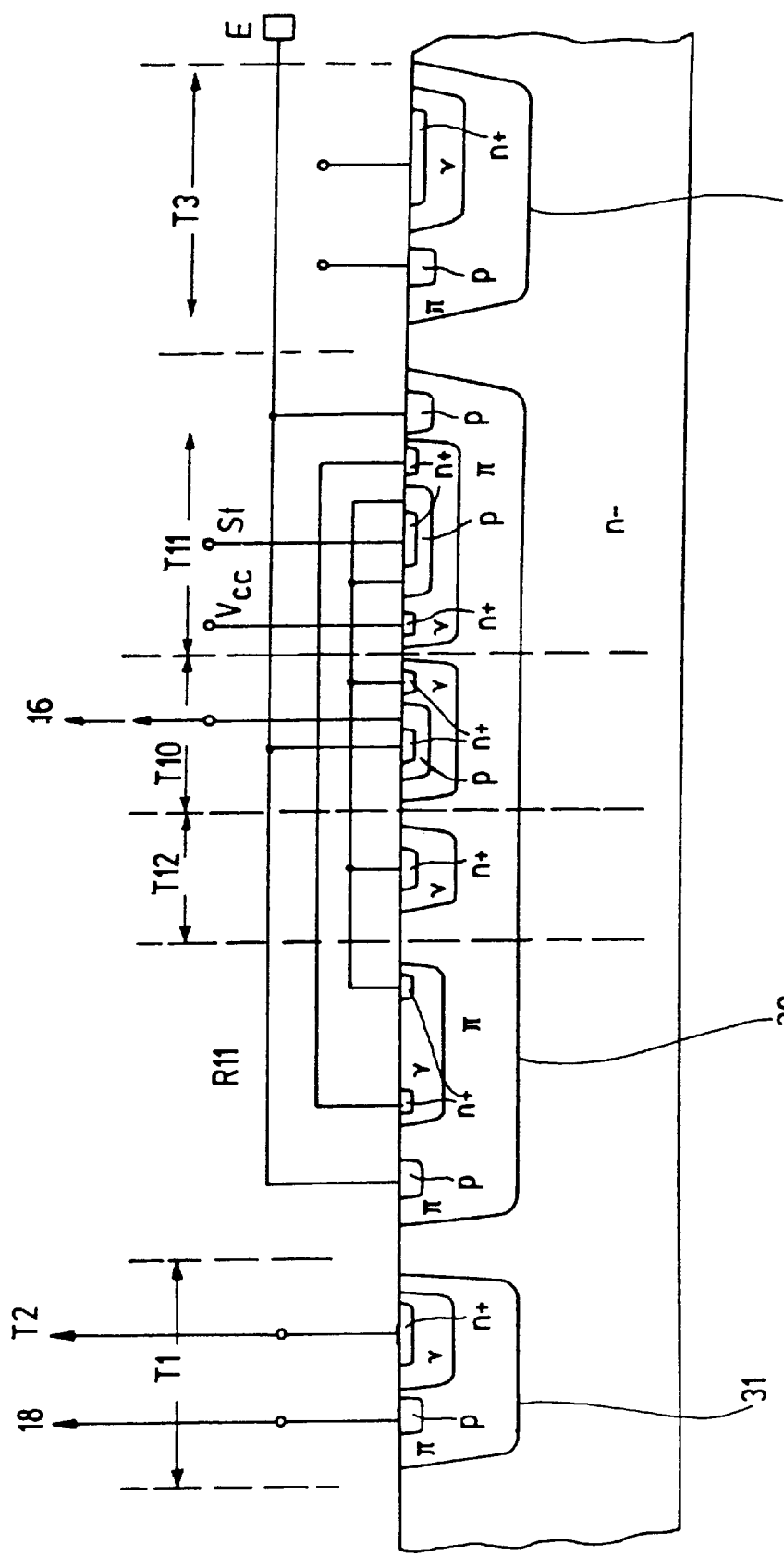
FIG. 2b shows a second diagram of the diffusion zones that are present in the output stage of FIG. 1.

FIG. 2b shows a schematic sectional diagram through monolithically integrated output stage 10 according to another embodiment of the present invention. The same parts as in FIG. 2a are labeled with the same notation and will not be explained again here. In this embodiment, external terminal K and resistor R6 are omitted.

Output transistor T11, transistors T10 and T12 as well as resistor R11 are integrated here into a common π trough 30. Switching stage T1 is located in a separate π trough 31.

Transistor T12 is defined by an n⁺ region forming the collector, a ν region surrounding the n+ region and forming the emitter, and the base being formed by π trough 30. Provision is also made for a ν region that forms resistor R11. π trough 30 is in turn connected to external emitter terminal E across one or more terminals (two in this example) designed as p regions.

Transistor T1 here is part of a triple Darlington with transistors T1, T2, and T3. The ν region here is connected to the base of transistor T2 (not shown) across an n+ region (emitter T1). π trough 31 forms the base of transistor T1, which is connected to control logic 18 across a p region.

FIGS. 2a and 2b also show switching stage T3 of power switching transistor 12, which is located in a separate π trough 32. π trough 32 forms the base of switching stage T3, while an n⁺region and the ν region surrounding the n⁺region form the emitter of switching stage T3. The emitter of switching stage T3 is connected to current sensor 14, while the base is connected to the emitter of switching stage T2.

Additional components of the circuit, in particular logic circuit 16 and control logic 18, are not shown in the diagrams for the sake of clarity.

The individual diffusion regions can be produced by known methods of bipolar power semiconductor manufacture with a relatively small area required.

Because the circuit components assigned to logic output St, in particular transistors T10, T11, T12, and resistor R11, are accommodated jointly in a common π trough 30, output transistor T11 is wired as a pull-up transistor in the collector circuit (emitter of output transistor T11 is connected to logic output St). This ensures that an active high signal on the collector of transistor T10 is in phase opposition to a low interference signal which can occur due to inverse operation of output stage 10. The collector voltage of power switching transistor 12 is pulled here to values less than 0 volt, so the junctions between π troughs 30 and 32 and the n⁻ region (collector C) are no longer reliably blocked. Transistor T10 can be blocked in this way, so that output transistor T11 would notch up (i.e., become unblocked). However, this is prevented by transistor T12, which would notch up (i.e., become unblocked) in this assumed interference case, because its base is formed by π trough 30, so that a current flowing across resistor R11 can flow further across transistor T12. Transistor T11 thus remains blocked.

According to another embodiment of the present invention, the ν regions of transistors T10 and T12 may be combined to save space. The collector region of transistor T12 may be implemented as a ν region with an enclosed n+ region or only as an n⁺ region. (FIGS. 2a and 2b show only an arrangement with a ν region.)

Monolithically integrated output stage 10 can also be implemented for multiple different threshold values of load current I and multiple logic outputs St accordingly, where each logic output St is allocated to a certain load current threshold.

Furthermore, threshold values of other variables (output voltage, chip temperature) can also be detected and assigned to one or more logic outputs.

What is claimed is:

1. A monolithically integrated output stage, comprising:

a power switching transistor;

a detection device coupled to the power switching transistor including at least one of:
an arrangement detecting a current related parameter of the power switching transistor;

a switching logic element coupled to the power switching transistor and including an output transistor, the switching logic element switching the output transistor when a predetermined current related threshold has been reached with respect to the power switching transistor;

a logic output coupled to an emitter of the output transistor, the output transistor supplying a high signal to the logic output when the predetermined current related threshold has been reached with respect to the power switching transistor; and a switching device coupled to the output transistor, the switching device blocking a conduction of the output transistor in response to a negative collector voltage appearing at the power switching transistor.

2. The monolithically integrated output stage according to claim 1, wherein the switching device includes a first transistor, and wherein a collector of the first transistor is coupled to a base of the output transistor, an emitter of the first transistor is coupled to a collector of the power switching transistor, and a base of the first transistor is coupled to an emitter of the power switching transistor.

3. The monolithically integrated output stage according to claim 2, wherein the switching logic element includes a logic circuit and a second transistor for activating the output transistor, wherein a base of the second transistor is coupled to the logic circuit, a collector of the second transistor is coupled to the base of the output transistor, and an emitter of the second transistor is coupled to the emitter of the power switching transistor.

4. The monolithically integrated output stage according to claim 3, further comprising a common trough that includes each one of the first transistor, the second transistor, and the output transistor.

5. The monolithically integrated output stake according to claim 4, wherein the common trough is electroconductively coupled to the emitter of the power switching transistor through at least one contact point.

* * * * *